(12) United States Patent
Reid et al.

(10) Patent No.: US 6,214,193 B1
(45) Date of Patent: Apr. 10, 2001

(54) ELECTROPLATING PROCESS INCLUDING PRE-WETTING AND RINSING

(75) Inventors: Jonathan D. Reid, Sherwood; Steven W. Taatjes, West Linn; Robert J. Contolini, Lake Oswego; Evan E. Patton, Portland, all of OR (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/374,253

(22) Filed: Aug. 13, 1999

Related U.S. Application Data

(62) Division of application No. 09/096,015, filed on Jun. 10, 1998.

(51) Int. Cl.[7] ........................................... C25D 5/02
(52) U.S. Cl. .............................. 205/122; 205/220
(58) Field of Search .................................. 205/122, 123, 205/157; 204/212; 118/409, 416

(56) References Cited

U.S. PATENT DOCUMENTS

| | | | |
|---|---|---|---|
| 3,798,056 | 3/1974 | Okinaka et al. ................. | 117/113 |
| 3,950,184 | * 4/1976 | Adams et al. ..................... | 134/10 |
| 4,339,319 | * 7/1982 | Aigo ................................. | 204/224 |
| 4,373,988 | 2/1983 | Bauser et al. .................... | 156/622 |
| 4,466,864 | * 8/1984 | Bacon et al. ..................... | 204/15 |
| 4,856,456 | * 8/1989 | Hillman et al. .................. | 118/500 |
| 5,000,827 | * 3/1991 | Schuster et al. .................. | 204/15 |
| 5,169,408 | 12/1992 | Biggerstaff et al. ............. | 29/25.01 |
| 5,312,487 | * 5/1994 | Akimoto et al. ................. | 118/52 |
| 5,340,437 | 8/1994 | Erk et al. ......................... | 156/639 |
| 5,472,592 | 12/1995 | Lowery ........................... | 205/137 |
| 5,670,034 | 9/1997 | Lowery ........................... | 205/143 |
| 5,677,000 | * 10/1997 | Yoshioka et al. ................ | 427/240 |
| 5,893,966 | 4/1999 | Akram et al. .................... | 205/137 |
| 5,930,549 | * 7/1999 | Kim et al. ........................ | 396/611 |
| 6,077,412 | * 6/2000 | Ting et al. ....................... | 205/143 |
| 6,099,702 | * 8/2000 | Reid et al. ....................... | 204/212 |

* cited by examiner

Primary Examiner—Kathryn Gorgos
Assistant Examiner—Erica Smith-Hicks
(74) Attorney, Agent, or Firm—Skjerven Morrill MacPherson LLP; David E. Steuber

(57) ABSTRACT

A plating cell has an inner plating bath container for performing electroplating on a work piece (e.g., a wafer) submerged in a solution contained by the inner plating bath container. A reclaim inlet funnels any solution overflowing the inner plating bath container back into a reservoir container to be circulated back into the inner plating bath container. A waste channel is also provided having an inlet at a different height than the inlet of the reclaim channel. After electroplating, the wafer is lifted to a position and spun. While spinning, the wafer is thoroughly rinse with, for example, ultra pure water. The spin rate and height of the wafer determine whether the water and solution are reclaimed through the reclaim channel or disposed through the waste channel.

10 Claims, 1 Drawing Sheet

US 6,214,193 B1

ELECTROPLATING PROCESS INCLUDING PRE-WETTING AND RINSING

This is a division of application Ser. No. 09/096,015, filed Jun. 10, 1998.

BACKGROUND OF THE INVENTION

Electroplating is a process for depositing a metal layer on a work piece such as a semiconductor wafer. In conventional plating, a wafer is processed serially through three separate stages: pre-treatment, plating, and rinse.

After the wafer is prepared for electroplating in one or more pre-treatment cells in the pre-treatment stage, the wafer is transported to an electroplating cell in the plating stage.

In the electroplating cell, the wafer is immersed in a bath containing a solution of dissolved salts of the metal to be deposited. An anode and cathode terminal are provided in the bath with the wafer attached to the cathode. A direct current is applied between the anode and cathode causing the dissolved salts to chemically reduce and form the corresponding metal on portions of the wafer exposed to the current and solution.

After plating is completed, the wafer is removed from the solution bath. Sometimes, a small amount of rinsing (i.e., pre-rinsing) using ultra pure water is performed in the plating cell causing ultra pure water to enter the solution bath. However, the resulting dilution of the dissolved salt concentration in the bath limits the amount of rinsing in the plating cell. Therefore, the rinsing over the solution bath is incomplete. In this partially rinsed state, the wafer awaits transport to a separate cell in the rinsing stage for a more thorough rinse and dry.

One problem with this system is that often substantial time (e.g., minutes) elapses between the electroplating in the plating cell and the rinsing while the system awaits availability of a rinse cell, a transport system, or a human operator. Substantial time may elapse when, for example, there is throughput bottleneck in the rinse stage. During this time, solution molecules may stay attached to the wafer due to the relatively low surface energy of the solution. This allows the solution, in some cases, to chemically react with the elements of the wafer, particularly metallic elements. For example, a water-based salt solution tarnishes a copper work piece if exposed even for a short time. As circuit feature dimensions progress farther into the submicron range, such tarnishing can significantly reduce die yields.

Another problem with this system is that the plating cell cannot be used while the wafer awaits transport to the rinsing stage, leaving the plating cell underutilized.

Therefore, there is a clear need for a system that decreases the time lag between the plating and rinse stages.

SUMMARY OF THE INVENTION

A plating cell has a wafer holder that can selectively spin a wafer. An inner plating bath container is positioned along the axis of rotation of the wafer. A first channel (e.g., a reclaim channel) has a first inlet at least partially surrounding the axis. A second channel (e.g., a waste channel) has a second inlet at least partially surrounding the axis of rotation of the wafer. The second inlet (e.g., the waste inlet) is provided above the first inlet (e.g., the reclaim inlet). An actuator selectively moves the wafer holder along the axis so that the wafer holder can be positioned at a height below the first inlet.

The following occurs within this single plating cell. A wafer is first electroplated by lowering the wafer holder to a position in the inner plating bath container that is below a plating solution level. After electroplating, the wafer is raised out of the plating bath and spun so that the spun-off water and plating solution enters the reclaim or waste inlets. When the spun-off water and plating solution enters the waste inlet, a relatively large volume of rinse solution (e.g., 10 milliliters or more) can be applied (e.g., sprayed) onto the wafer to thoroughly rinse the wafer. The wafer can also be subsequently dried by spinning the wafer at a relatively fast spin rate.

The principles of the present invention reduce the time lag between the plating and rinsing stage. Therefore, unwanted chemical reactions (e.g., corrosion and galvanic reactions) are prevented and a good surface finish is achieved. In one embodiment, the wafer surface is completely and simultaneously covered with water during rinsing. Time delay between water coverage at one point on the wafer surface compared to another point may result in galvanic corrosion on the wafer surface. When this occurs, copper is dissolved where water coverage is adequate but is deposited where it is inadequate.

DETAILED DESCRIPTION OF THE INVENTION

Figure 1:
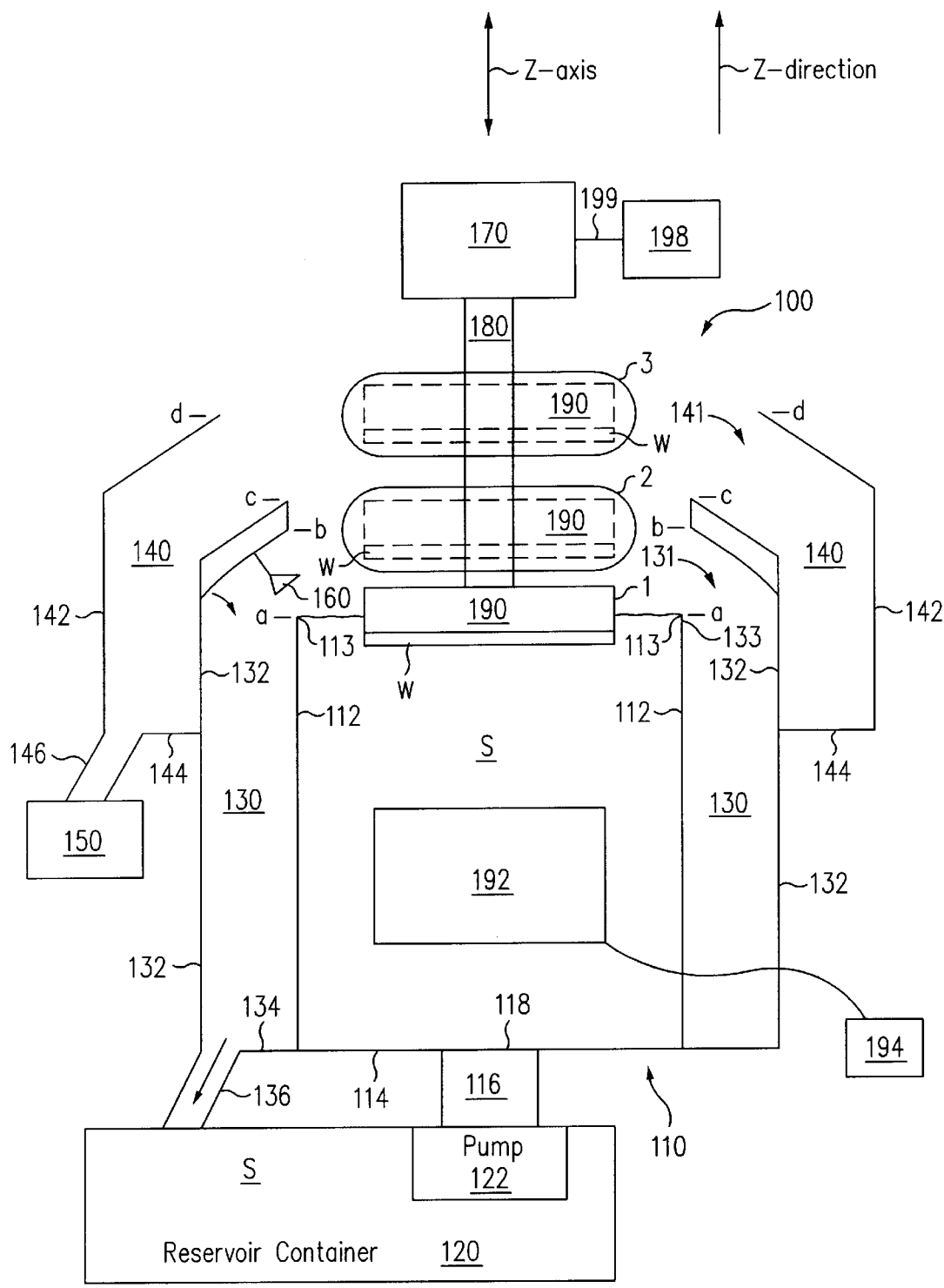
FIG. 1 is a cross-sectional schematic diagram of a plating cell capable of performing both plating and rinsing cell according to one embodiment of the invention.

The principles of the present invention solve the problem of time lag between the plating and rinse stages by providing a plating cell that performs both plating and full rinse. Performing both plating and full rinse would be undesirable in the prior art plating cell at least because the full rinse would cause rapid dilution of the electroplating solution. The plating cell may also have the ability to perform pre-wetting.

FIG. 1 is a schematic diagram of a plating cell 100 capable of performing both plating and rinsing according to one embodiment of the invention. Cell 100 includes a pump 122 that pumps solution S from reservoir container 120, through solution supply channel 116, through an inlet 118 in a base 114 of an inner plating bath container 110, and into inner plating bath container 110. Solution S is a plating solution that may be, for example, a water-based solution with 170 grams per liter of sulfuric acid and 17 grams per liter of the dissolved plating metal (e.g., copper).

As solution S rises, walls 112 contain solution S until solution S reaches the lowest portion of a first reclaim inlet 131 at a height "a" (relative to the base 114) in the z-direction parallel to the z-axis. All heights referred to herein are with respect to the z-direction and are referenced to the base 114 of container 110. In FIG. 1, lip 113 defines the lower portion of reclaim inlet 131. Reclaim inlet 131 also has an upper edge at height "b".

After the inner plating bath container 110 completely fills with solution S, excess solution S spills over the lower portion 133 of reclaim inlet 131 and into a reclaim channel 130. This condition is referred to herein as "overflow mode." In overflow mode, walls 112 and 132 channel solution S through reclaim channel 130 and into a reclaim drain 136 provided in a base 134 of channel 130. Reclaim drain 136 channels solution S back into reservoir container 120. The condition in which solution S follows the above described circulation path is referred to herein as "circulation mode". Reclaim inlet 131 may circumscribe the inner plating bath container 110 about the z-axis.

A second inlet (e.g., a waste inlet) is also provided circumscribed around the inner plating bath container 110 about the z-axis. Waste inlet has a lower edge at height "c" and an upper edge at height "d". Waste solution that enters waste channel 140 is channeled by walls 132 and 142 and into a waste drain 146 in a base 144 of waste channel 140. The waste solution is received by a waste system 150 where the solution is discarded from cell 100.

A wafer holder 190, capable of conveying current, holds a wafer W and can move in the z-direction (e.g., vertically) by being connected by shaft 180 to an actuator 170. The actuator 170, which may be, for example, a leadscrew with an encoder, may be controlled by an instruction on instruction terminal 199 connected to actuator 170. Instruction terminal 199 carries an instruction generated by controller 198.

Electroplating may be performed in circulation mode as follows. In response to an instruction on instruction terminal 199, actuator 170 positions wafer holder 190 so that wafer W is held in solution S, for example, at position 1. A current source 192, disposed within the inner plating bath container 110, emits current through solution S and into wafer W. This causes metal to form on the surface of wafer W as the metal salts within the solution S reduce.

Following plating, wafer W is raised to position 2 where wafer holder 190 is spun about the z-axis. While wafer holder 190 is spinning, a rinse solution (e.g., ultra pure water) is sprayed on the wafer W using spray nozzle 160, thereby perform partial rinsing (i.e., pre-rinsing). Spray nozzle 160 is positioned so that rinsing solution sprayed by spray nozzle 160 strikes wafer W (e.g., underneath the wafer W). The spin rate at position 2 may range from, for example, 300 to 600 rotations per minute (RPM). At this spin rate, the spun-off solution travels substantially horizontal under the influence of gravity. If position 2 is such that wafer W is between height "a" and "b" the spun-off solution collects within reclaim channel 130 and returns to reservoir container 120. To avoid excessively rapid dilution of solution S, the amount of ultra pure water used for rinsing at position 2 is, for example, in the range of from 0 to 8 milliliters.

Following the pre-rinse at position 2, wafer holder is raised to position 3 for a complete rinse. Once in position 3, the wafer is spun at a rate of, for example, from 300 to 600 RPM while being sprayed with ultra pure water. Position 3 is located between height "c" and "d" so that the solution that is spun-off the wafer W enters waste inlet 141 of waste channel 140. Enough ultra pure water is sprayed onto the wafer so that the wafer W is thoroughly rinsed. A typical range of water volume for accomplishing this is from 10 to 50 milliliters or from 10 to 150 milliliters or even more. The amount of water volume may be very large without diluting the solution S because substantially all, if not all, of the water sprayed onto the wafer W is discarded in waste system 150.

A typical elapsed time between the removing of the wafer W from solution S and the beginning of pre-rinse at position 2 is less than one second. A typical elapsed time for performing pre-rinse is approximately one or two seconds. A typical elapsed time between the removal of wafer W from solution S and the beginning of the complete rinse at position 3 is less than three seconds.

In one embodiment, the wafer surface is completely and simultaneously covered with water during rinsing. Time delay between water coverage at one point on the wafer surface compared to another point may result in galvanic corrosion on the wafer surface. When this occurs, copper is dissolved where water coverage is adequate but is deposited where it is inadequate.

Once the wafer W has been thoroughly rinsed, the wafer W can be spun to dry at a spin rate of, for example, from 400 to 800 RPM. Therefore, within a very short period after the completion of electroplating, the wafer W is thoroughly rinsed and dried. Therefore, the wafer W is not exposed to corrosive elements as long as the wafer W might be in the prior art.

The present invention provides several major advantages. First, the pre-rinse stage returns substantially all of the rinse solution back into the plating solution reducing waste emissions to substantially zero during the pre-rinse stage. Second, when spray nozzle 160 is directed at the wafer W rotating at 30 RPM or more using a nozzle that covers the full radius of the wafer W, unwanted chemical reactions (e.g., corrosion and galvanic reactions) are prevented. Therefore, a good surface finish is achieved. Third, a volume of rinse solution for the pre-rinse spray may be selected such that the volume of the circulating solution remains constant.

Cell 100 may also be used for pre-wetting by spraying a wetting solution (e.g., ultra pure water) onto the wafer W before electroplating while the wafer is positioned over inner plating bath container 110.

Position 2 has been described as being such that wafer W is between height "a" and "b". However, position 2 may be much higher than height "b" if the spin rate for reclaim is reduced. Furthermore, the lower the spin rate, the higher the wafer holder 190 must be above height "a" in order for the spun-off solution to enter reclaim inlet 131. The higher the position above the target inlet 131 or 141, the lower the spin rate must be to allow the spun-off solution to enter the appropriate inlet 131 or 141. Therefore, position 2 may be higher than height "b" and position 3 may be higher than position "d". Gravity or other forces will affect the optimal spin rates at a given position. The above spin rates assume that the negative z-direction is the direction of the force of normal gravity.

Position 2 is described as being the position for pre-rinse in which the spun-off solution is reclaimed. However, wafer holder 190 may skip the pre-rinse stage at position 2 and go directly to the position 3 for the thorough rinse. Alternatively, the pre-rinse stage may be accomplished at position 3 instead of position 2. This may be accomplish by spinning the wafer W at a relatively low spin rate of approximately 100 RPM. In this case, the spun-off solution is not substantially horizontal, but falls angularly downward into reclaim inlet 131 or into inner plating bath container 110. After pre-rinse, the spin rate is increased so that the spun-off solution enters waste inlet 141.

Wafer holder 190 may be any holder capable of holding a wafer W such as a clamshell apparatus described in a U.S. patent application Ser. No. 08/969,984 filed Nov. 13, 1997, entitled "CLAMSHELL APPARATUS FOR ELECTRO-CHEMICALLY TREATING SEMICONDUCTOR WAFERS", now U.S. Pat. No. 6,156,167, issued on Dec. 5, 2000 which is incorporated herein by reference in its entirety.

Current source 192 may be, for example, an anode cell as described in a co-pending U.S. patent application Ser. No. 08/969,196 filed Nov. 13, 1997, entitled "MEMBRANE PARTITION SYSTEM FOR PLATING OF WAFERS", now U.S. Pat. No. 6,126,798, issued on Oct. 3, 2000, which is incorporated herein by reference in its entirety. Current source 192 may also be a copper sheet connected to base 114 and connected to a voltage source 194.

Although inlets 131 and 141 are described as being circumscribed entirely about the z-axis, the circumscription may be only partial to obtain some of the benefit of the present invention.

Although cell 100 has been described as operating in circulation mode in which solution S pours over lip 113 and back into reservoir container 120, solution S may be at a level below height "a" during electroplating. If cell 100 is not in circulation mode, reclaim inlet 131 may be higher than waste inlet 141.

Throughout the description and claims, a "channel" is defined as a "structure defining a passage." Throughout the description and claims, "lower" means "more in the negative z-direction" and "higher" means "more in the positive z-direction." Thus, a "lowest portion of an object" means a "portion of an object that is positioned farthest in the negative z-direction." In the claims, the recitation of a "first" and "second" item per se should not be interpreted as meaning that the items are necessarily different items. For example, a first rinse solution and a second rinse solution may have the same composition or different compositions. Furthermore, "first", "second" and "third" are not necessarily intended to indicate any time sequencing.

Although the height "c" is described as being above height "b", height "c" may be the same height as height "b". Note that the inlet size of each inlet 131 and 141 may change by, for example, providing a hinge.

Although the present invention has been described with reference to specific embodiments, these embodiments are illustrative only and not limiting. Many other applications and embodiments of the present invention will be apparent in light of this disclosure and the following claims.

What is claimed is:

1. A method of rinsing a semiconductor wafer following the electroplating of a metal layer on the wafer comprising:

lifting the wafer out of an electroplating solution;

applying a first volume of rinse solution to the wafer;

spinning the wafer so as to spin off the first volume of rinse solution from wafer; and returning at least a portion of the first volume of rinse solution to the electroplating solution.

2. The method of claim 1, further comprising:

applying a second volume of a rinse solution to the wafer;

spinning the wafer so as to spin off the second volume of rinse solution from the wafer; and discarding at least a portion of the second volume of rinse solution.

3. The method of claim 2, wherein applying a second volume comprises applying over 10 milliliters of rinse solution to the wafer.

4. The method of claim 3, wherein applying a second volume comprises applying over 10 to 150 milliliters of rinse solution to the wafer.

5. The method of claim 3, wherein applying a second volume comprises applying over 50 milliliters of rinse solution to the wafer.

6. The method of claim 2, wherein spinning the wafer so as to spin off the second volume of rinse solution comprises spinning the wafer in a range of from 300 to 800 rotations per minute.

7. The method of claim 1, wherein applying a first volume of rinse solution comprises applying less than 10 milliliters of rinse solution to the wafer.

8. The method of claim 7, wherein applying a first volume of rinse solution comprises applying 0 to 8 milliliters of rinse solution to the wafer.

9. The method of claim 2 wherein spinning the wafer so as to spin off the first volume of rinse solution from the wafer comprises spinning the wafer at a first height above the electroplating solution and wherein spinning the wafer so as to spin off the second volume of rinse solution from the wafer comprises spinning the wafer at a second height above the electroplating solution.

10. The method of claim 9 wherein the first height is less than the second height.

* * * * *